United States Patent
Oh

(10) Patent No.: US 11,627,274 B2
(45) Date of Patent: Apr. 11, 2023

(54) IMAGE SENSING PIXELS WITH LATERAL OVERFLOW STORAGE

(71) Applicant: Microsoft Technology Licensing, LLC, Redmond, WA (US)

(72) Inventor: Minseok Oh, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/233,318

(22) Filed: Apr. 16, 2021

(65) Prior Publication Data

US 2022/0337774 A1 Oct. 20, 2022

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14612* (2013.01); *H01L 27/14643* (2013.01);
(Continued)

(58) Field of Classification Search
CPC ...... H04N 5/378; H04N 5/3559; H04N 5/361; H04N 5/37452; H01L 27/14612; H01L 27/14643
See application file for complete search history.

(56) References Cited

U.S. PATENT DOCUMENTS

| | | | |
|---|---|---|---|
| 10,397,503 B2 | 8/2019 | Malinge et al. | |
| 2006/0146159 A1* | 7/2006 | Farrier | H04N 5/3745 348/E3.018 |

(Continued)

FOREIGN PATENT DOCUMENTS

EP 1244218 A1 9/2002

OTHER PUBLICATIONS

Ma et al., "Characterization of Quanta Image Sensor Pump-Gate Jots With Deep Sub-Electron Read Noise", IEEE Journal of the Electron Devices Society, vol. 3, Issue 6, Sep. 22, 2015, pp. 472-480.

Morimoto et al., "Megapixel time-gated SPAD image sensor for 2D and 3D imaging applications", In Journal of Optica, vol. 7, No. 4, Apr. 16, 2020, pp. 346-354.

(Continued)

*Primary Examiner* — Abdelaaziz Tissire
(74) *Attorney, Agent, or Firm* — Alleman Hall Creasman & Tuttle LLP

(57) ABSTRACT

An image sensor includes sensing pixels, each comprising a photodetector in electrical communication with a floating diffusion capacitor via a transfer gate, and a lateral overflow storage capacitor coupled to the floating diffusion capacitor via a lateral overflow control gate. A first readout circuit circuitry located between the transfer gate and the lateral overflow control gate comprises a first amplifier. A second readout circuitry, located opposite the lateral overflow control gate from the first readout circuitry, comprises a second amplifier. Following image integration, charge stored on the floating diffusion capacitor is readout using the first readout circuitry and charge stored on the lateral overflow storage capacitor is readout using the second readout circuitry. In a second readout, charge stored on the photodetector is readout using the first readout circuitry with a first amplification applied and charge stored on the photodetector is readout with a second, different amplification applied.

6 Claims, 11 Drawing Sheets

(51) Int. Cl.
*H04N 5/355* (2011.01)
*H04N 5/361* (2011.01)
*H04N 5/374* (2011.01)
*H04N 5/3745* (2011.01)

(52) U.S. Cl.
CPC ........... *H04N 5/3559* (2013.01); *H04N 5/361* (2013.01); *H04N 5/37452* (2013.01)

(56) References Cited

U.S. PATENT DOCUMENTS

| | | | |
|---|---|---|---|
| 2009/0045319 A1* | 2/2009 | Sugawa | H04N 5/37452 250/208.1 |
| 2010/0140452 A1 | 6/2010 | Vampola et al. | |
| 2011/0007196 A1* | 1/2011 | Yamashita | H01L 27/14609 348/294 |
| 2017/0244921 A1* | 8/2017 | Velichko | H04N 5/363 |
| 2018/0227528 A1* | 8/2018 | Johnson | H04N 9/045 |
| 2021/0235026 A1* | 7/2021 | Xu | H04N 5/357 |

OTHER PUBLICATIONS

Oh et al., "3.0 μm Backside Illuminated, Lateral Overflow, High Dynamic Range, LED Flicker Mitigation Image Sensor", Retrieved from: https://web.archive.org/web/20200529014701/https://www.imagesensors.org/Past%20Workshops/2019%20Workshop/2019%20Papers/R34.pdf, Retrieved Date: May 29, 2020, 4 Pages.

Sakano et al., "A 132dB Single-Exposura-Dynamic-Range CMOS Image Sensor with High Temperature Tolerance", In Proceedings of IEEE International Solid-State Circuits Conference, Feb. 16, 2020, pp. 106-108.

"International Search Report and Written Opinion Issued in PCT Application No. PCT/US22/022699", dated May 31, 2022, 12 Pages.

Shike, et al., "A Global Shutter Wide Dynamic Range Soft X-Ray CMOS Image Sensor With Backside-Iluminated Pinned Photodiode, Two-Stage Lateral Overflow Integration Capacitor, and Voltage Domain Memory Bank", In Journal of IEEE Transactions on Electron Devices, vol. 68, Issue 4, Apr. 2021, pp. 2056-2063.

* cited by examiner

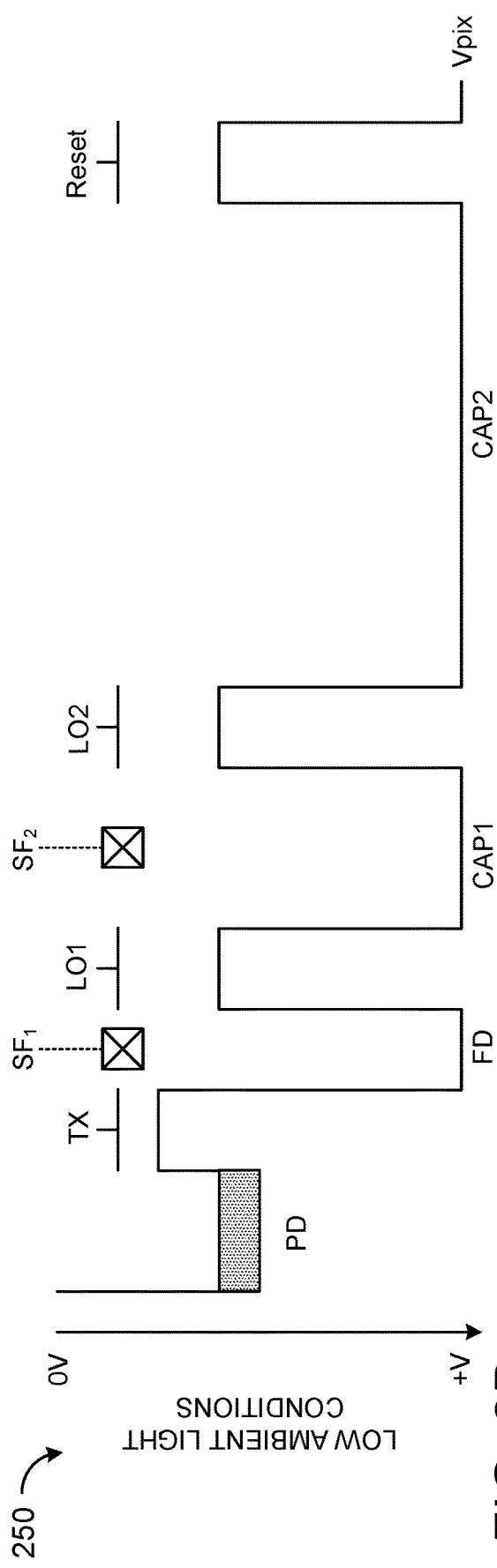

IMAGE SENSING PIXELS WITH LATERAL OVERFLOW STORAGE

BACKGROUND

In low-light environments, or other photon-limited situations, the amount of light illuminating a subject is often inadequate to produce a high-quality image. When compensation methods are applied, the noise level produced in images often increases significantly due to increased exposure times and boosting sensor gains. As such, reduced frame rates and reduced dynamic ranges often accompany low-light image sensors, making such imaging devices unsuitable for some applications.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

One example provides an image sensor comprising sensing pixels, each sensing pixel comprising a photodetector in electrical communication with a floating diffusion capacitor via a transfer gate, and a lateral overflow storage capacitor coupled to the floating diffusion capacitor via a lateral overflow control gate. A first readout circuit circuitry located between the transfer gate and the lateral overflow control gate comprises a first amplifier. A second readout circuitry, located opposite the lateral overflow control gate from the first readout circuitry, comprises a second amplifier. Following image integration, charge stored on the floating diffusion capacitor is readout using the first readout circuitry and charge stored on the lateral overflow storage capacitor is readout using the second readout circuitry. In a second readout, charge stored on the photodetector is readout using the first readout circuitry with a first amplification applied and charge stored on the photodetector is readout with a second, different amplification applied.

BRIEF DESCRIPTION OF THE DRAWINGS

FIG. 2B shows a plot of a potential diagram during integration for the pixel of FIG. 2A during low light conditions.

FIG. 2C shows a plot for a potential diagram during integration time for the pixel of FIG. 2A during high light conditions.

DETAILED DESCRIPTION

Figure 1:
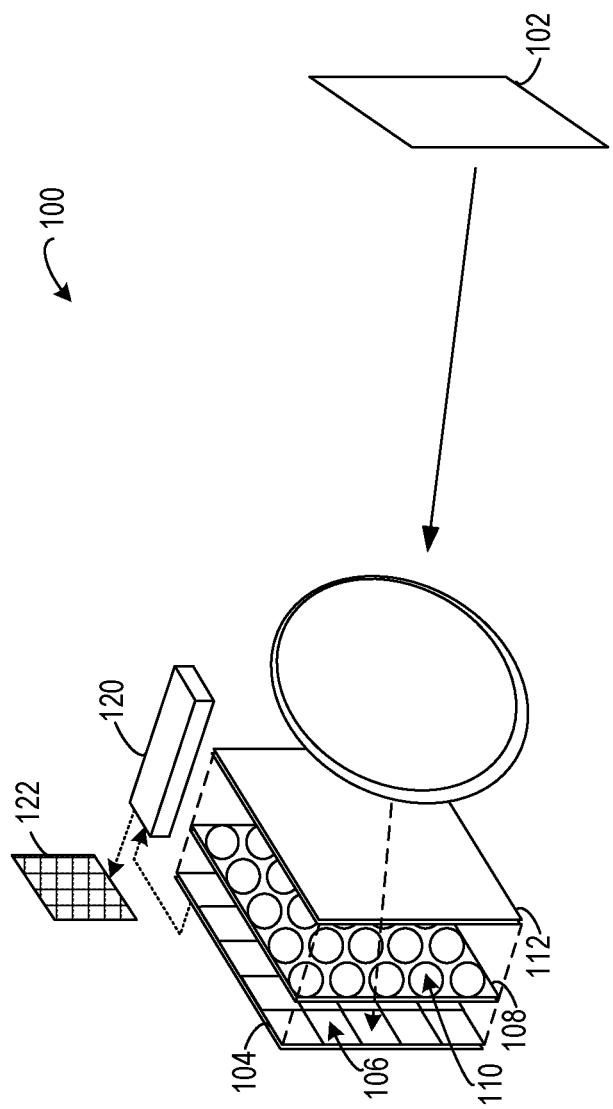
FIG. 1 schematically shows an example imaging system.

Low light image sensors may be implemented in security applications, automotive applications, nighttime imaging, military and first responder equipment, and/or any imaging system used in dark conditions without illumination. A goal is to develop sensors that exhibit sub e-read noise, high quantum efficiency, high dynamic range, and maintain a high frame rate. A high dynamic range (HDR) of greater than 120 dB can be desirable to meet or exceed industry benchmarks.

Many low light imaging applications can benefit from a relatively higher frame rate. However, current methods of extending dynamic range utilize a greater readout and/or increased sampling for each pixel, which slows down the row read time and thus slows down the frame rate.

Conventional complementary metal-oxide-semiconductor (CMOS) image sensors often use low capacitance floating diffusion, which can necessitate a high conversion gain. This provides strong signal amplification to the up-front signal, but results in a low full-well capacity, and thus a low maximum signal-to-noise ratio. As such, there may be a low noise floor, but image quality decreases when the signal is near saturation or during conditions with normal or higher illumination. Although temporal noise may be reduced, the overall image quality suffers.

One approach to solving this issue involves single-photon avalanche diode (SPAD)-based photon counting. However, the full-well capacity of such SPAD gates is limited by the binary image frame rate. Another downside to this approach is that due to the high e-field at the pn junction, high voltage (20-30V) is needed to reverse the junction, generating high electric field in the pixel. As such, there exists an increased chance of generating hot pixels. Dark current is also increased in some pixels, which can lead to relatively higher spatial noise and dark signal non-uniformity.

Photon counting can be performed based on CMOS image sensors, but such sensors can have relatively low frame rates. Such pixels tend to use a very high conversion gain, in order to measure transfer of a single photoelectrons to the floating diffusion. However, the charge transfer and readout are slow, suppressing full-well capacity and dynamic range. Further, in any of these approaches, once the noise floor reaches a sub e-level, temporal noise is dominated by photon-shot noise.

Accordingly, the present disclosure addresses these issues by introducing a single-exposure image sensor that features a multi-stage lateral overflow integrating capacitor with additional in-pixel readout transistors (e.g., source follower and selection gates) for each additional stage. In this way, low (e.g., sub e-) read noise and high dynamic range (e.g., 120 dB0) can be achieved without slowing down frame rate. Further, the pixel architecture may be used to implement a spatial noise canceling methodology, whereby gate-induced source leakage is measured and subtracted from high conversion gain readout. In this way, spatial noise can be precisely accounted for within each pixel during extremely low light conditions.

FIG. 1 shows aspects of an example imaging system 100. The imaging system 100 also may be referred to herein as a camera. The term 'camera' refers herein to any imaging component having at least one optical aperture and sensor array configured to image a scene or subject 102. The imaging system 100 includes a sensor array 104 of individually addressable pixels 106. In some implementations, the pixels may be CMOS elements, but other suitable architectures are envisaged as well. Each pixel is responsive to light over a broad wavelength band. For silicon-based (e.g. CMOS) pixels, the wavelength response may range from 300 to 1000 nm, for example. The sensor array 104 is schematically illustrated with only twenty-five pixels 106 for simplicity, although any suitable other number of pixels may be used.

Microlens array 108 optionally may be arranged over sensor array 104. Microlens array 108 includes a plurality of microlens elements 110. Each microlens element 110 of microlens array 108 may be registered to a pixel 106 of the sensor array 104. When included, microlens array 108 may provide a larger effective fill factor at each of the pixels, for increased collection efficiency and reduced crosstalk between pixels.

Optical shutter 112 optionally may be arranged over sensor array 104, so as to optically cover the sensor array. Optical shutter 112 may be configured as a global shutter, wherein accumulated charge is stored in a light-shielded region on a per-pixel or per-group-of pixels basis. Optical shutter 112 may additionally or alternatively be configured as a rolling shutter, wherein readouts of different portions of the image frames are performed at different times, such as on a sequential, line-by-line basis. In some implementations, optical shutter 112 may be omitted from the imaging system 100. For example, the optical shutter may be omitted in order to reduce a cost and/or complexity of an imaging optical stack. In some cases, omitting the optical shutter may allow the imaging optical stack to advantageously have a smaller optical total track length (TTL).

A controller 120 may include a logic machine and associated storage machine. The storage machine may hold instructions that are executable by the logic machine to enact any operation, algorithm, computation, or transformation disclosed herein. In some implementations, the logic machine may take the form of an application-specific integrated circuit (ASIC) or system-on-a-chip (SoC), in which some or all of the instructions are hardware- or firmware-encoded. Additional configurations for controller 120 are discussed herein with regard to FIG. 9.

The controller 120 may be configured to individually control the pixels 106 of the sensor array 104 to selectively acquire images of at least a portion of the scene 102 viewed by the sensor array 104. The controller 120 may be configured to control the sensor array 104 to acquire a full-field 2D image. Controller 120 may be configured to address all of the pixels 106 of sensor array 104 to acquire a 2D passive light image (e.g., monochrome or color image) of the scene 102 based on ambient illumination. In implementations where optical shutter 112 is included, controller 120 may be configured to switch optical shutter 112 to allow light in the visible spectrum to pass through to the sensor array 104. For flat-imaging—for spectral light including both visible and infrared (IR) light—addressing the pixels 106 may include integrating the intensity of ambient light received at each pixel 106 and associating the integrated intensity of the ambient light in the sub-band with the portion of the 2D image corresponding to that pixel.

The controller 120 may be configured to output 2D image data in any suitable form. As one example, the controller 120 may be configured to output a matrix of pixels 122. In some examples, the controller 120 may output the matrix of pixels 122 as a data structure in which each element of the matrix corresponds to a different pixel, and each element of the matrix includes an array of values corresponding to the one or more visible light values for that pixel. The controller 120 may be configured to output the matrix of pixels 122 (and/or any other suitable parameter value) to any suitable recipient internal or external to the imaging system 100. In one example, the controller 120 may be configured to output the matrix of pixels 122 to another processing component for additional image processing (e.g., filtering, computer vision). In some examples, the processing component may be incorporated into the imaging system 100. In other examples, the processing component may be incorporated into a remote computing device in communication with the imaging system 100. In further examples, the controller 120 may be configured to output the matrix of pixels 122 to an external display device for visual presentation as an image.

Figure 2A:
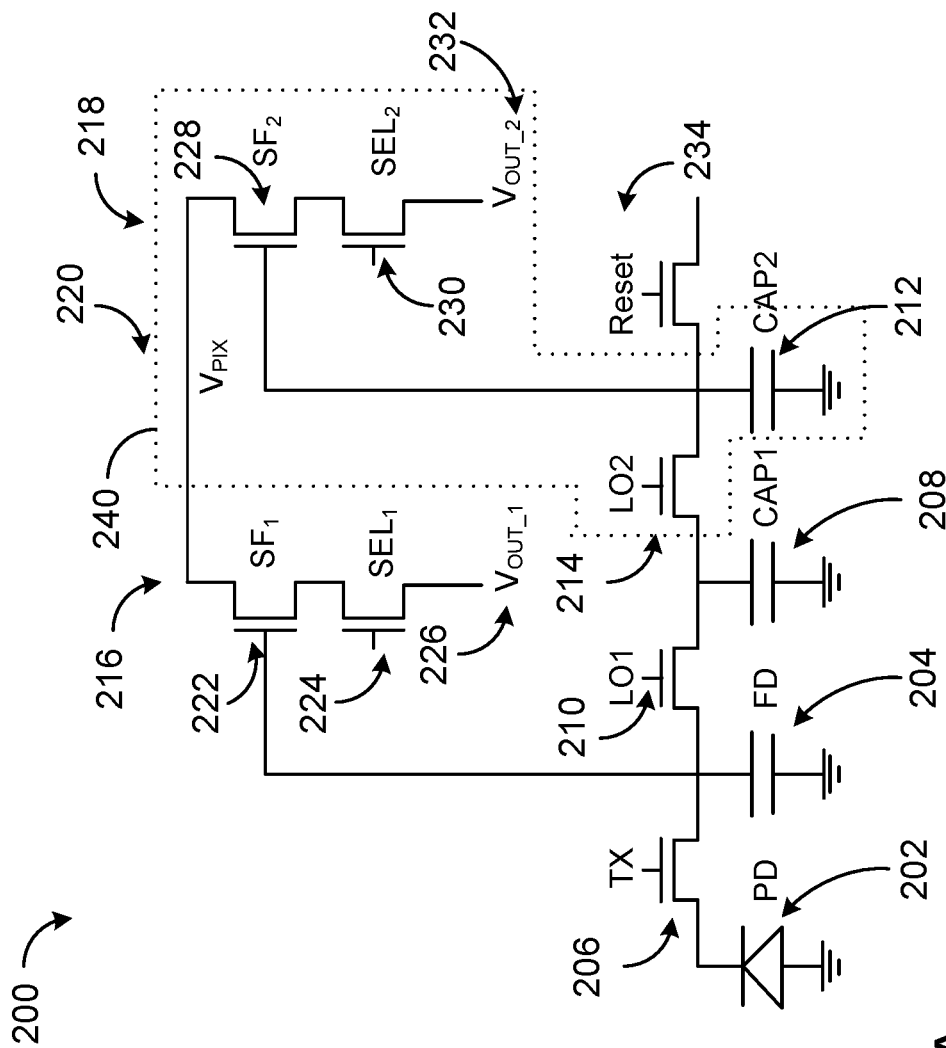
FIG. 2A schematically shows an example low light sensing pixel with lateral overflow.

FIG. 2A shows an example schematic of a lateral overflow sensing pixel 200. Sensing pixel 200 is an example of pixels 122 depicted in FIG. 1. Sensing pixel 200 includes a photodetector 202 (PD) configured to accumulate charge during an image integration period. In examples described herein, photodetector 202 is a photodiode, such as a complementary metal-oxide-semiconductor (CMOS) photodiode. However, in other examples, photodetector 202 may be a photogate, another active-pixel sensor, passive-pixel sensor, or other suitable photosensor. A floating diffusion capacitor 204 (FD) is positioned in electrical communication with photodetector 202 via a transfer gate 206 (TX) configured to control charge flow between photodetector 202 and floating diffusion capacitor 204.

A first lateral overflow storage capacitor 208 (CAP1) is configured to store charge overflow from floating diffusion capacitor 204. A first lateral overflow control gate 210 (LO1) may be configured to control charge flow between floating diffusion capacitor 204 and first lateral overflow storage capacitor 208. In this example, a second lateral overflow storage capacitor 212 (CAP2) is configured to store charge overflow from first lateral overflow storage capacitor 208. A second lateral overflow control gate 214 (LO2) may be configured to control charge flow between first lateral overflow storage capacitor 208 and second lateral overflow storage capacitor 212.

A first readout circuit 216 and a second readout circuit 218 may be located on opposite sides of first lateral overflow control gate 210, each of which may be exposed to pixel voltage 220 (Vpix) when activated. First readout circuit 216 may include a first amplifier, a first source follower 222 ($SF_1$) across which the output voltage is measured, a first row select transistor 224 ($SEL_1$) operable to actuate pixel 200 for readout, and a first collection node 226 ($V_{OUT\_1}$). Similarly, second readout circuit 218 may include a second amplifier, a second source follower 228 (SF2), a second row select transistor 230 (SEL2), and a second collection node 232 ($V_{OUT\_2}$). Selective operation of each gate under a clocking signal determines where within pixel 200 charge integrates over time and when that accumulated charge is read out at collection nodes 226 and 232. A reset gate 234 may be operable to drain charge accumulated at photodetector 202, floating diffusion capacitor 204, first lateral overflow storage capacitor 208, and second lateral overflow storage capacitor 212.

By employing two lateral overflow capacitors, the full-well capacity of pixel 200 is increased without sacrificing the sensitivity of photodetector 202. FIG. 2B shows an example potential diagram 250 for pixel 200 at low light conditions, such as on the lower end of the dynamic range for pixel 200. FIG. 2C shows an example potential diagram 260 for pixel 200 at high light conditions, such as on the higher end of the dynamic range for pixel 200. As shown in potential diagram 250, when illumination is low, electrons are only collected at photodetector 202, as photodetector 202 does not saturate over the image integration. When incident light increases and the photodetector is saturated, the electrons overflow to floating diffusion capacitor 204. When floating diffusion capacitor 204 is filled, electrons overflow to first lateral overflow storage capacitor 208, and then to second lateral overflow storage capacitor 212. In this way, the dynamic range of pixel 200 may extend from the lowest readable signal on the floating diffusion, to a state in which each well is filled.

The conversion gains associated with the capacitors may progressively increase across triple conversion gains. As an example, the conversion gains may increase at 10x from floating diffusion capacitor 204 to first lateral overflow storage capacitor 208, and to second lateral overflow storage capacitor 212. As one non-limiting example, floating diffusion capacitor 204 may have a first, relatively higher conversion gain (referred to herein as "high conversion gain" or HCG) of 0.9 fF or 170 uV/e-, first lateral overflow storage capacitor 208 may have a second, intermediate conversion gain (referred to herein as "medium conversion gain" or MCG) of 9.4 fF or 17 uV/e-, and second lateral overflow storage capacitor 212 may have a third, relatively lower conversion gain (referred to herein as "low conversion gain" or LCG) of 94.1 fF of 1.7 uV/e-. The capacitors themselves may have similar storage ratios (e.g., ~7ke-, ~70ke-, ~700ke-).

By employing multiple readout circuits (216, 218), all of the capacitors in pixel 200 can be readout at the same time, and thus the frame rate can be increased. Additional stages of overflow (e.g., CAP3) can be appended to pixel 200 to further increase the full well capacity while maintaining frame rate. For each stage, additional readout circuitry, transistors for controlling the readout, amplifiers, etc. may be added, with the reset gate moved to the end of the circuit. An example overflow stage unit that can be repeated and appended to readout circuit 218 is indicated by dotted lines at 240. In some examples, such circuitry may be interleaved.

Figures 3A, 3B:
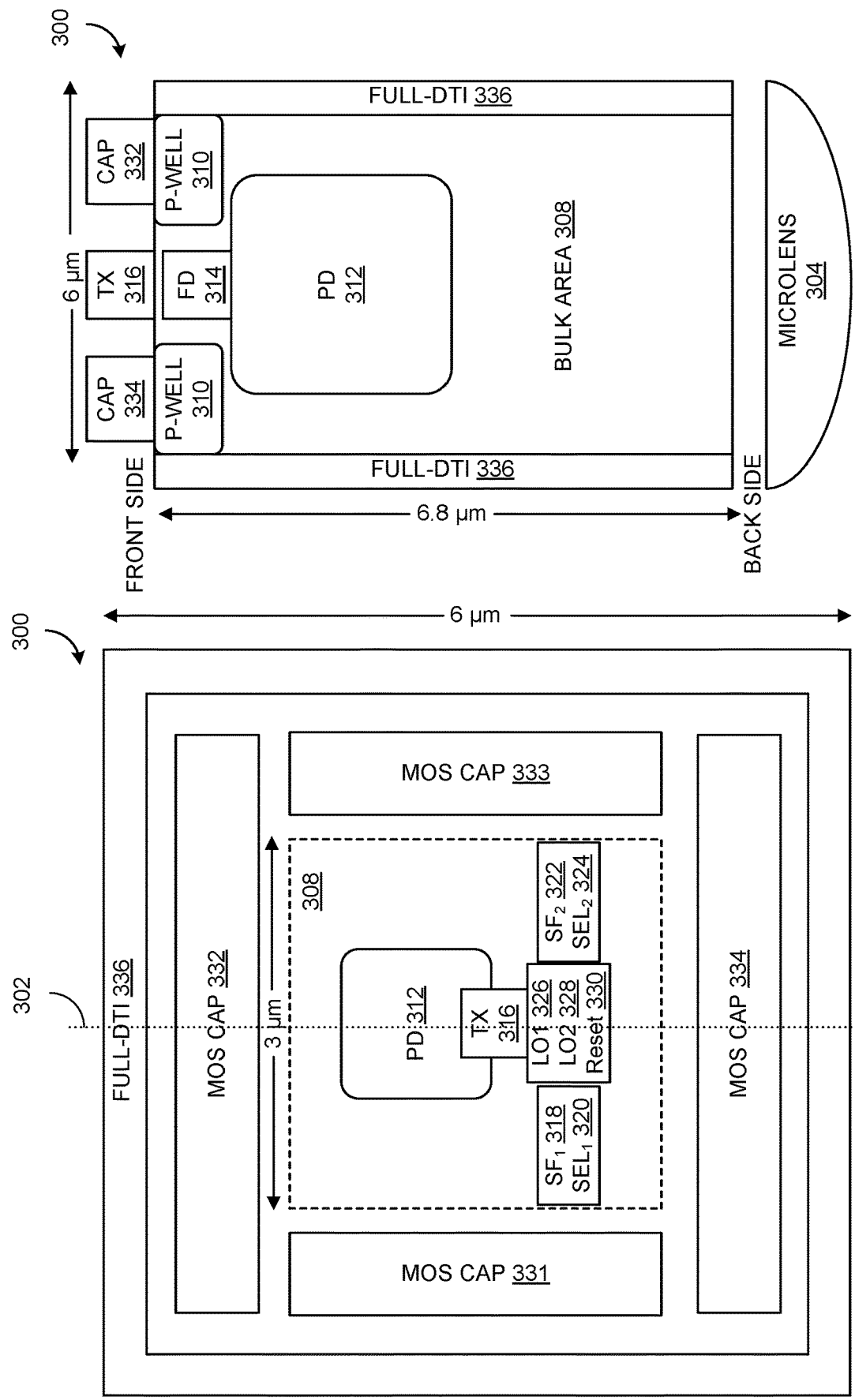
FIG. 3A schematically shows an example pixel layout.
FIG. 3B schematically shows a cross-section of the example pixel of FIG. 3A.

FIGS. 3A and 3B schematically show an example layout of a pixel 300, with FIG. 3B showing a cross section along line 302. Pixel 300 may be an example of pixel 200. Pixel 300 is shown as a backside illuminated photodiode, with light incident on pixel 300 focused by a micro-lens 304 onto the pixel area, generating photoelectrons within a bulk area 308 (e.g. a gradient epitaxial silicon region). Bulk area 308 may include additional components towards the back side in order to enhance the near IR quantum efficiency process.

As shown, pixel 300 has a surface pitch of 6 μm×6 μm. As shown in FIG. 3B, the depth of pixel 300 may be larger than the surface pitch, however any suitable dimensions may be used. Using a relatively large pixel is common in low-light applications and allows room to position the front-side electronics alongside larger capacitors and p-wells 310. Given a 6 μm pitch, for example, a 3 μm ×3 μm region may be utilized to place photodiode 312 and the rest of the transistors and circuitry, including floating diffusion 314, transfer gate 316, first source follower 318, first selection gate 320, second source follower 322, second selection gate 324, first lateral overflow control gate 326, second lateral overflow control gate 328, and reset gate 330. The remaining area can be used to place the metal-oxide-superconductor (MOS) capacitors (331, 332, 333, 334). In the example of pixel 200, MOS capacitor 331 may an example of CAP1, while CAP2 may be represented by MOS capacitors 332, 333, and 334. Such lateral overflow integration capacitors can be fabricated onto the pixel substrate through standard processing techniques.

To achieve a number of 1.7 μV/e may utilize a relatively significant area dedicated for these capacitors. Additionally or alternatively, metal-insulator-metal (MIM) capacitors may be used, as they occupy a metal layer, and not the silicon area. For example, pixel 300 may include multiple layers of metals on the front side of the pixel for routing of the pixel signal. This may allow for further reduction in the pitch of pixel 300. To add additional overflow phases, MIM capacitors, dynamic random-access memory (DRAM) capacitors (placed between the silicon layer and a metal layer), metal-oxide-metal (MOM) capacitors (placed in a metal layer), and/or any other suitable high-density capacitors can be used while maintaining pixel pitch on this order.

Since each floating diffusion is occupied by one pixel in a lateral overflow design, a shared architecture may not be suitable. However, in a non-shared pixel architecture, a full deep trench isolation (DTI) 336 may be used that passes all the way through bulk area 308, to thereby prevent blooming or cross-talk between neighboring pixels.

Figure 4A:
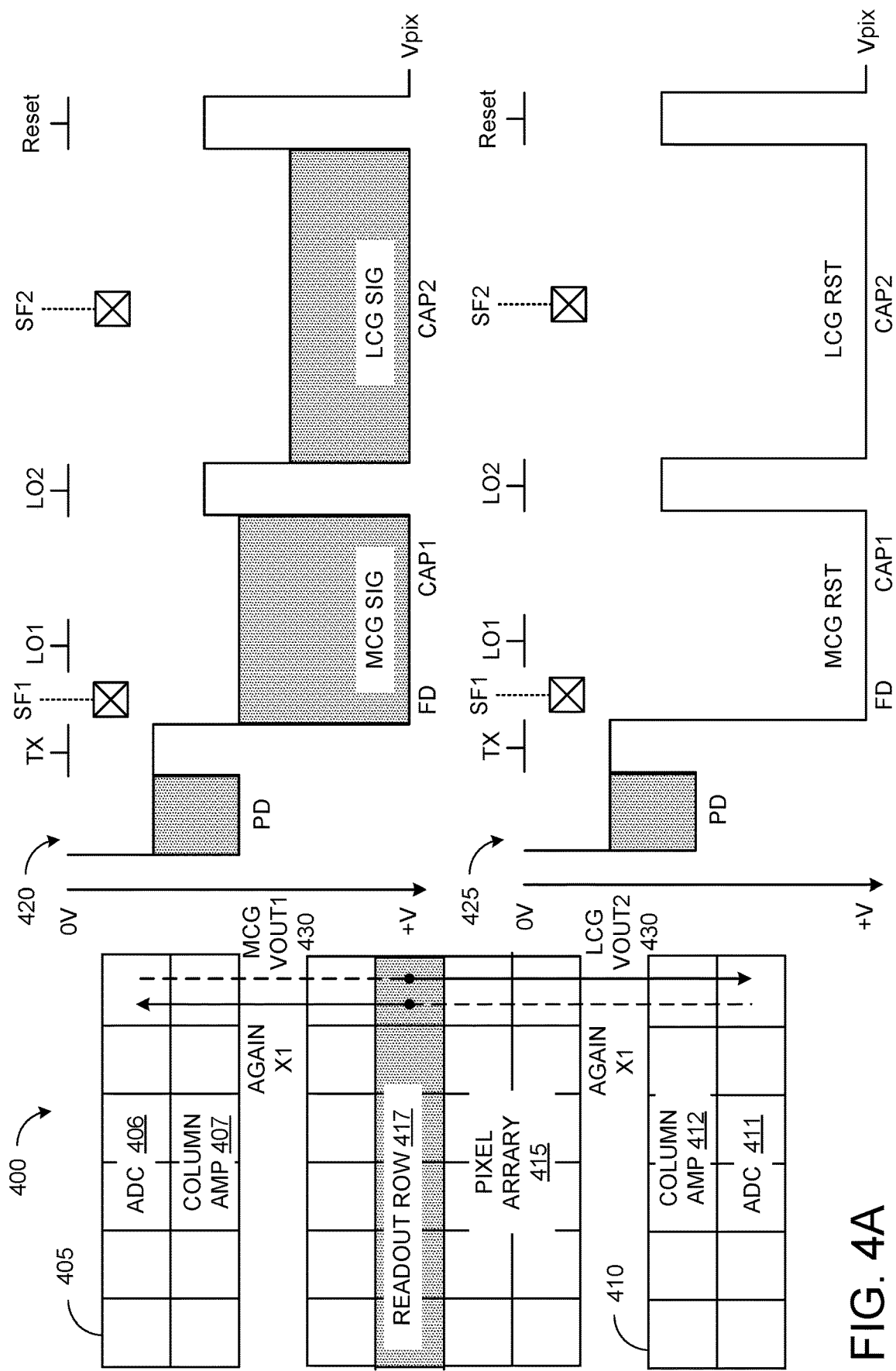
FIG. 4A shows an example first readout of the pixel of FIG. 2A.
Figure 4B:
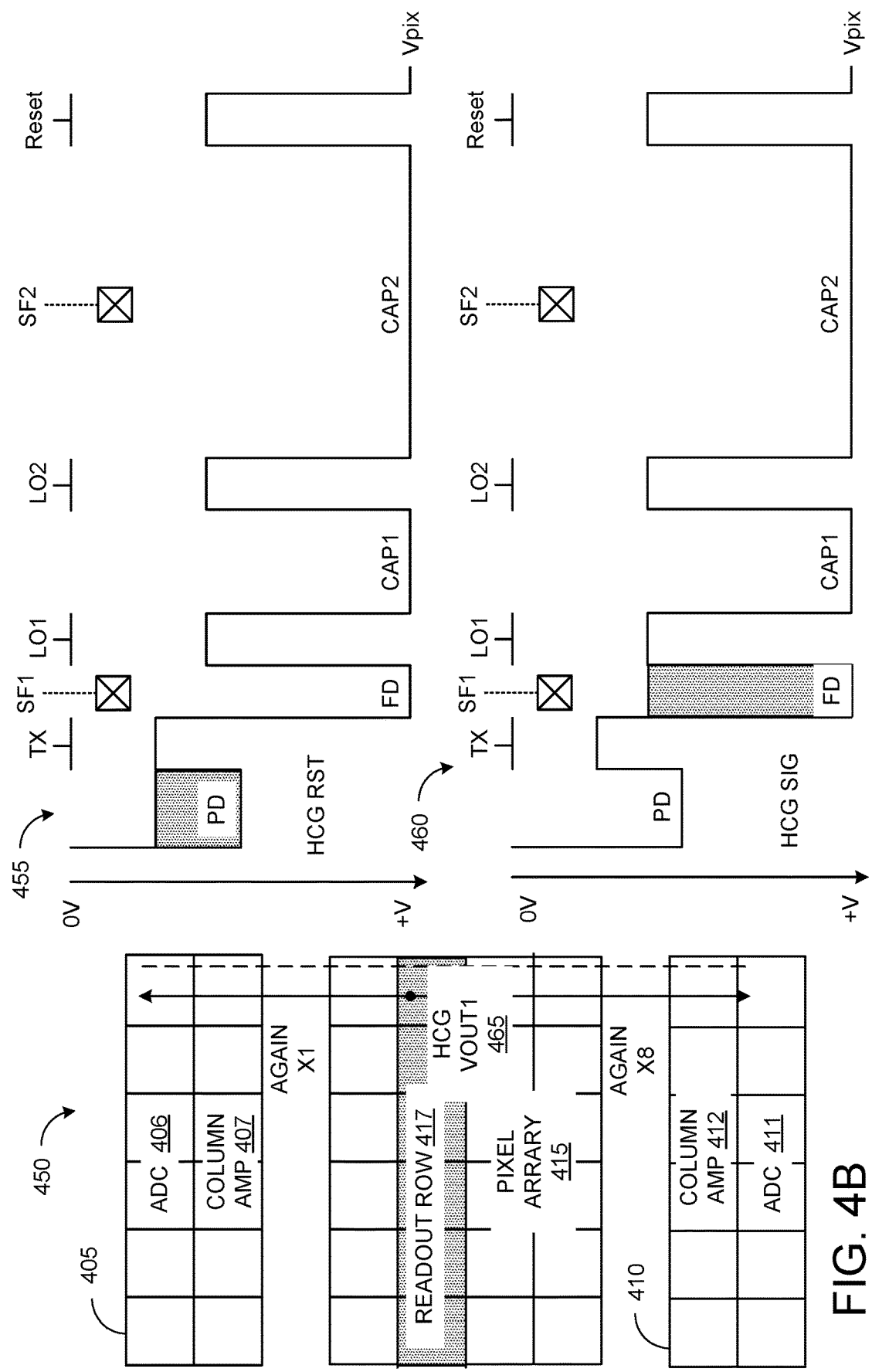
FIG. 4B shows an example second readout of the pixel of FIG. 2A.

FIGS. 4A and 4B show example first and second readouts for sensing pixel 200. To perform such a two-stage readout, the pixel array comprises two readout circuit blocks. As there are two source-follows per pixel, there are two column amplifiers and two sets of ADC blocks. The readout blocks may be similar to those used in conventional image sensors. The dual readout blocks allow for a faster readout, and may provide for full-resolution readout (e.g., 90 fps (frames per second) for rolling shutter imaging devices, or other suitable readout speed as based on the number of rows in the pixel array).

FIG. 4A shows an example of a first readout 400. Top readout block 405 includes ADC 406 and column amplifier 407. Analog-to-digital (AD) conversion may be performed by top readout block 405. Bottom readout block 410 includes analog-to-digital converter (ADC) 411 and column amplifier 412. Pixel array 415 includes a plurality of pixel rows, including readout row 417.

In this example, the first readout is the lateral overflow signal. In this case, readout may be performed via uncorrelated double sampling. This is due to the medium conversion gain (MCG) and lower conversion gain (LCG) capacitors already storing a signal, as shown at 420. Because of this, the reset level is not sampled first. Instead, the signal is read out first, then the capacitor is reset, then reset level is sampled, as shown at 425. This is uncorrelated double sampling, which inherently has high noise. However, because this sampling is not used for low light conditions, the signal to noise ratio may be sufficient. Both signals are readout at an analog gain of 1x. The MCG signal 430 (VOUT1) is readout by ADC 406 on top while the LCG signal 432 (VOUT2) is readout by ADC 411 on the bottom. In this way the MCG and LCG signals may be readout concurrently.

FIG. 4B shows the second readout 450. In the second readout, the low light signal is sampled directly from the photodiode. For photodiode signal sampling, the reset signal may be sampled first, as shown at 455. The high conversion gain is reset and sampled, charge is transferred from the photodiode to the floating diffusion, and then the signal is sampled, as shown at 460. The photodiode signal (HCG VOUT 465) is read at two different analog gains—analog gain X1 at ADC 406 and analog gain X8 at ADC 411. X8 comes with lower noise than lower analog gains, however other amplification gains may be used (X16, etc.). The full well capacity of the greater conversion gains is smaller. As such, the same signal (465) is also sampled at analog gain X1. Sampling the same signal at two different gains yields correlated double sampling.

Figure 5:
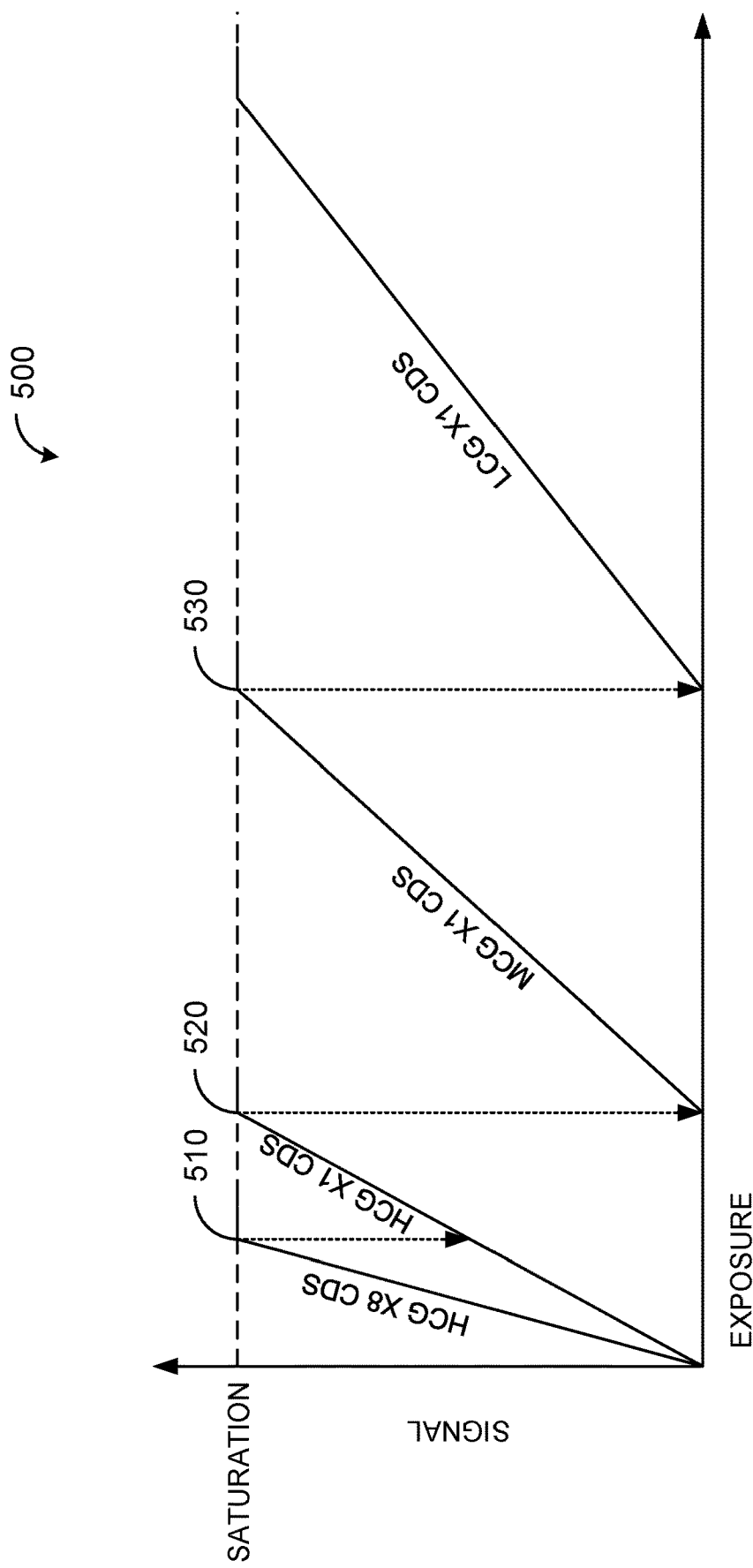
FIG. 5 shows an example signal response curve for the pixel of FIG. 2A.

FIG. 5 shows an overall signal response curve 500. Based on the correlated double sampling, the HCG 8× signal will reach saturation first. If the HCG 8× signal does not reach saturation, it will be the signal read, even though the HCG 1× signal will be significant enough to produce a reading.

If and when the HCG 8× signal saturates (e.g., at 510), the response switches to the signal of the HCG at analog gain X1. By switching in this way, an increased noise performance can be achieved at the baseline. If and when the HCG 1× signal saturates (e.g., at 520), the full-well capacity of the signal is extended, switching to the MCG signal, then to the LCG signal (e.g., at 530). This enables the extension of the dynamic range of the signal to >120 dB. The combined readings will generate the overall pixel intensity output for the image.

Figure 6:
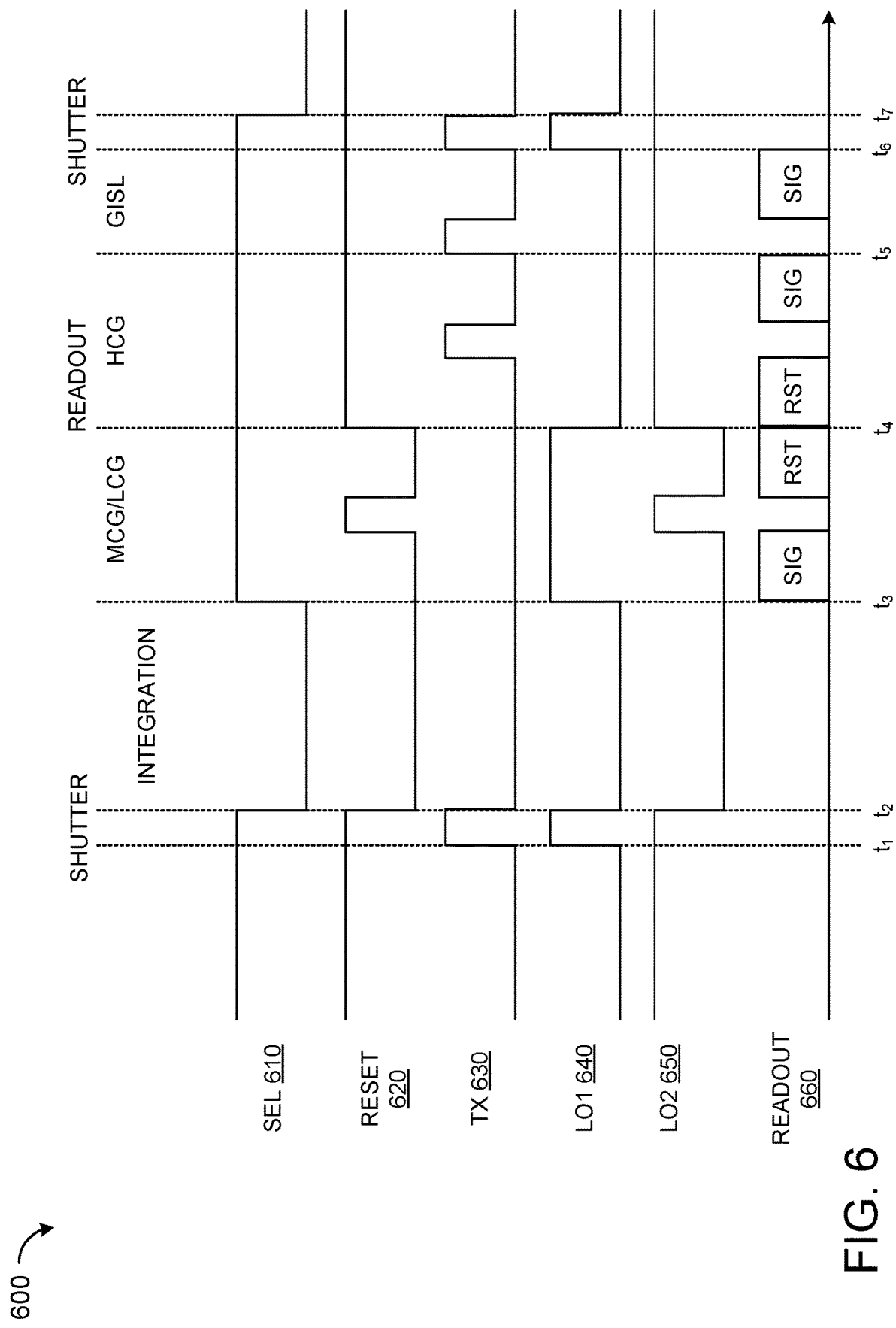
FIG. 6 shows an example timing diagram for operation of the pixel of FIG. 2A.

FIG. 6 shows an example timing diagram 600 for applications of pixel 200. Timing diagram 600 includes plot 610, indicating a status of a row select transistor (SEL), plot 620 indicating the status of a reset gate (RESET), and plot 630 indicating a status of a transfer gate (TX). Timing diagram 600 further includes plot 640 indicating a status of a first lateral overflow control gate (LO1), and plot 650 indicating a status of a second lateral overflow control gate (LO2). Timing diagram 600 also includes plot 660, indicating a readout status for the pixel (READOUT), such as whether a signal (SIG) or reset (RST) is being readout. Each gate status may indicate whether the gate is energized (higher value) or not energized (lower value)

From time $t_1$ to time $t_2$, a shutter event occurs, and the transfer gate and first lateral overflow control gate are energized, as shown at 630 and 640, respectively, while the row selection transistor, reset gate, and second lateral overflow control gate are maintained in an energized state, as shown at 610, 620, and 650, respectively. At time $t_2$, all gates are de-energized, and an integration period is extended from time $t_2$ to time $t_3$.

Following integration time, the selection gate is energized, inducing readout of that particular row. Timing diagram 600 indicates three separate readout options for the pixel. From time $t_3$ to time $t_4$, an extended dynamic range readout is enabled. First lateral overflow control gate is energized at time $t_3$, and a signal is read for the MCG and LCG, as described with regard to FIG. 4A. The reset gate is then pulsed, as is the second lateral overflow control gate, resetting the two overflow capacitors, which are then sampled at the reset level in an uncorrelated double sampling event.

At time $t_4$, the reset gate is energized, the first lateral overflow control gate is de-energized, and the second lateral overflow control gate is energized. From time $t_4$ to time $t_5$, readout of the HCG signal occurs, reading out the reset signal first, then pulsing the transfer gate, transferring charge from the photo diode to the floating diffusion and reading out the signal.

In extremely low light conditions, where only the HCG is readout, the readout from time $t_3$ to time $t_4$ can be skipped and HCG may be both amplified and read out at 8× and 1×, concurrently. The MCG and LCG can be turned off to save power, and/or an even higher frame rate can be realized. To extend the dynamic range out to 120 dB, the readout from time $t_3$ to time $t_4$ can be enabled.

Thus, for temporal noise, 0.5 e-, subelectron noise can be targeted by boosting high conversion gain, e.g., up to 220uV/e. This may reduce the overall capacity of the pixel, but also reduces temporal noise to subelectron levels. However, as temporal noise is decreased, the existing spatial noise may become dominant.

In conventional imaging sensors, and as shown in FIGS. 2A, 3A, and 3B, each pixel includes a photodetector, a transfer gate, and a floating diffusion. There is also a pinning implant (P-type for an N-type substrate) and a bulk substrate, which is grounded. To transfer charge from the photodetector to the floating diffusion, the transfer gate is activated, which generally causes the transfer gate voltage to increase to 2.8V or 3.3V. If the pinning is biased at ground, there will be a high electric field at the border of these subcomponents, causing band-band tunneling, whereby electrons held at the balance band can jump to the conduction band of the N-Type. If there is a defect in the substrate, such as an electron trap, the electrons can jump band to band much easier, known as trap assisted tunneling. This creates added signal and drives additional electrons to the floating diffusion that do not come from the photodiode.

The extent of the bending of this band, or the existence of a trap is random, causing pixel-to-pixel differences that manifest as spatial noise that is random, but consistent over time, as the transfer gate is actuated with the same pulse-width each time. This is also referred to as gate induced source leakage (GISL). For low-light imaging where the temporal noise is sub-electron, this spatial noise becomes noticeable. As shown in the pixel diagram of FIG. 2, the floating diffusion will integrate the GISL noise along with the photoelectrical signal when the transfer gate is pulsed. As such, an additional readout can be used to cancel out this GISL.

Returning to FIG. 6, the photodiode signal is sampled from time $t_3$ or time $t_4$ until time $t_5$. Immediately following this signal sampling, the photodiode is empty, as its contents have been transferred to the floating diffusion by pulsing the transfer gate. Then, while the photodiode is empty, the transfer gate is pulsed again at time $t_5$. This pulse generates just the GISL noise on top of zero actual signal. This noise signal is sampled, and can thus be subtracted from the earlier readout of the HCG. From time $t_6$ to time $t_7$, another shutter event occurs, preparing the pixel for another integration frame.

The GISL noise is predominantly uncovered during extreme low light conditions, and thus may only be performed for the 8× HCG. Note that the floating diffusion is not reset during this process, so the frame rate is not significantly impacted. The floating diffusion is still occupied with the signal from the photodiode and any GISL noise from the initial transfer gate actuation. In this scenario, another dose of GISL noise is then added, and then the difference measured or estimated.

Figure 7:
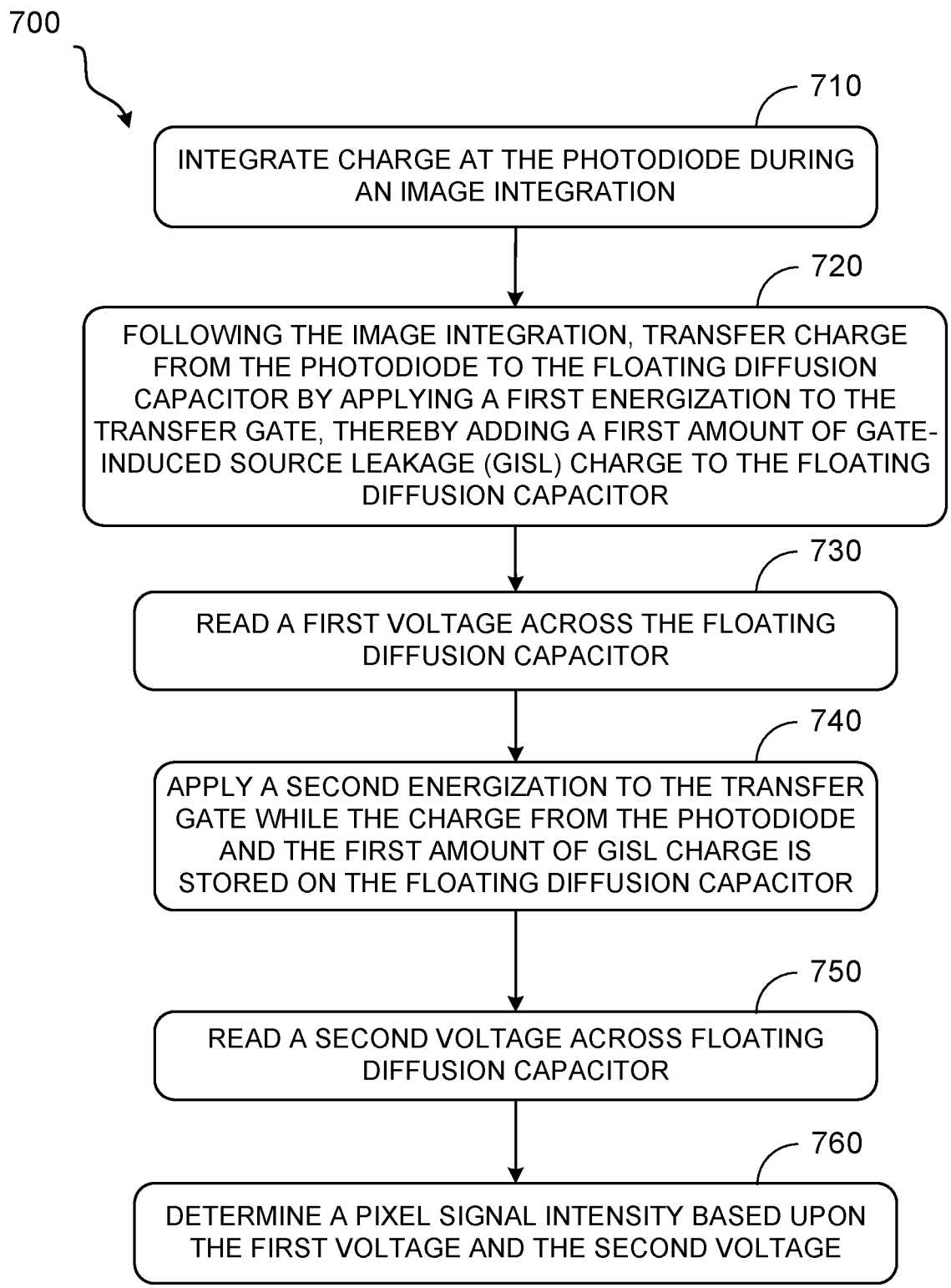
FIG. 7 shows an example method for operating a sensing pixel to compensate for spatial noise.

FIG. 7 shows an example method 700 for operating an image sensor to compensate for spatial noise. Such an image sensor may comprise a plurality of sensing pixels, each sensing pixel comprising a photodiode, a floating diffusion capacitor, and a transfer gate to control transfer of charge between the photodiode and the floating diffusion capacitor. References will be made to pixel 200, but method 700 may apply to any suitable image sensor with the above components. Method 700 will be described with reference to a single sensing pixel, but method 700 may be applied to one or more sensing pixels which may be clustered into rows as described.

At 710, method 700 includes integrating charge at the photodiode during an image integration. In particular, the image integration may be performed in low light conditions or even extremely low light conditions. Image integration may be performed for any suitable length of time, such as on the order of 10 µs in some examples.

At 720, method 700 includes, following the image integration, transferring charge from the photodiode to the floating diffusion capacitor by applying a first energization to the transfer gate, thereby adding a first amount of gate-induced source leakage charge to the floating diffusion capacitor.

At 730, method 700 includes reading a first voltage across the floating diffusion capacitor. This first voltage may thus include both the GISL charge and the charge accumulated during the image integration period. Reading a first voltage may include reading a reset value and then reading out a signal across the floating diffusion capacitor. The first voltage may thus be based on the reset value and the readout signal.

At 740, method 700 includes applying a second energization to the transfer gate while the charge from the photodiode and the first amount of GISL charge is stored on the floating diffusion capacitor. No further charge integration occurs at the photodiode between the first and second energizations of the transfer gate. In this way, no additional photoelectrons may have accumulated at the photodiode in the time between the first energization of the transfer gate and the second energization of the transfer gate. Any charge transferred during the second energization may be assumed to represent GISL noise. At 750, method 700 includes read a second voltage across floating diffusion capacitor. The second voltage may be based in part on a reset signal taken as part of reading the first voltage.

Continuing at 760, method 700 includes determining a pixel signal intensity based upon the first voltage and the second voltage. For example, the pixel signal intensity may be determined by subtracting the second voltage from the first voltage. In scenarios wherein each sensing pixel includes multiple conversion gain stages, the second voltage may only be subtracted from signal readout from high conversion gain stage.

Figure 8A:
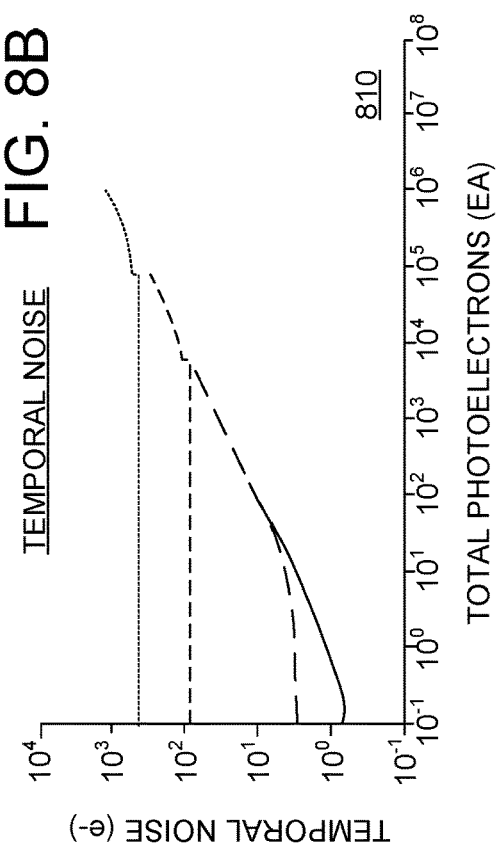
FIG. 8A shows an example sensor response simulation.
Figure 8B:
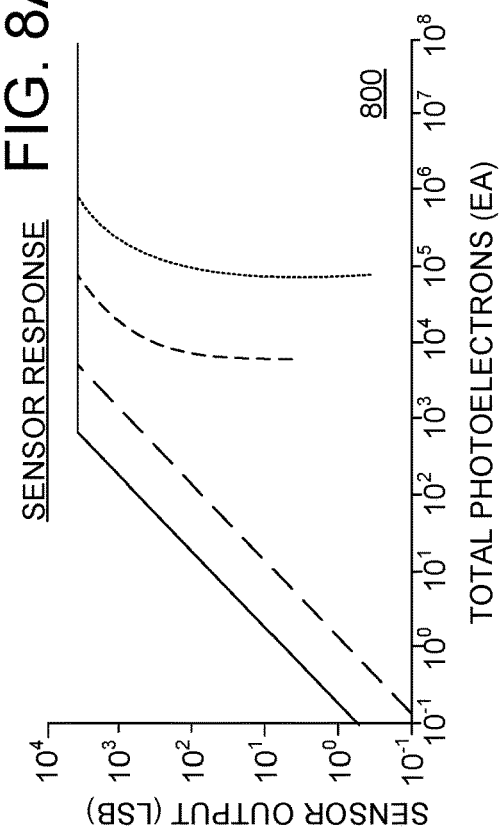
FIG. 8B shows an example temporal noise simulation.
Figure 8C:
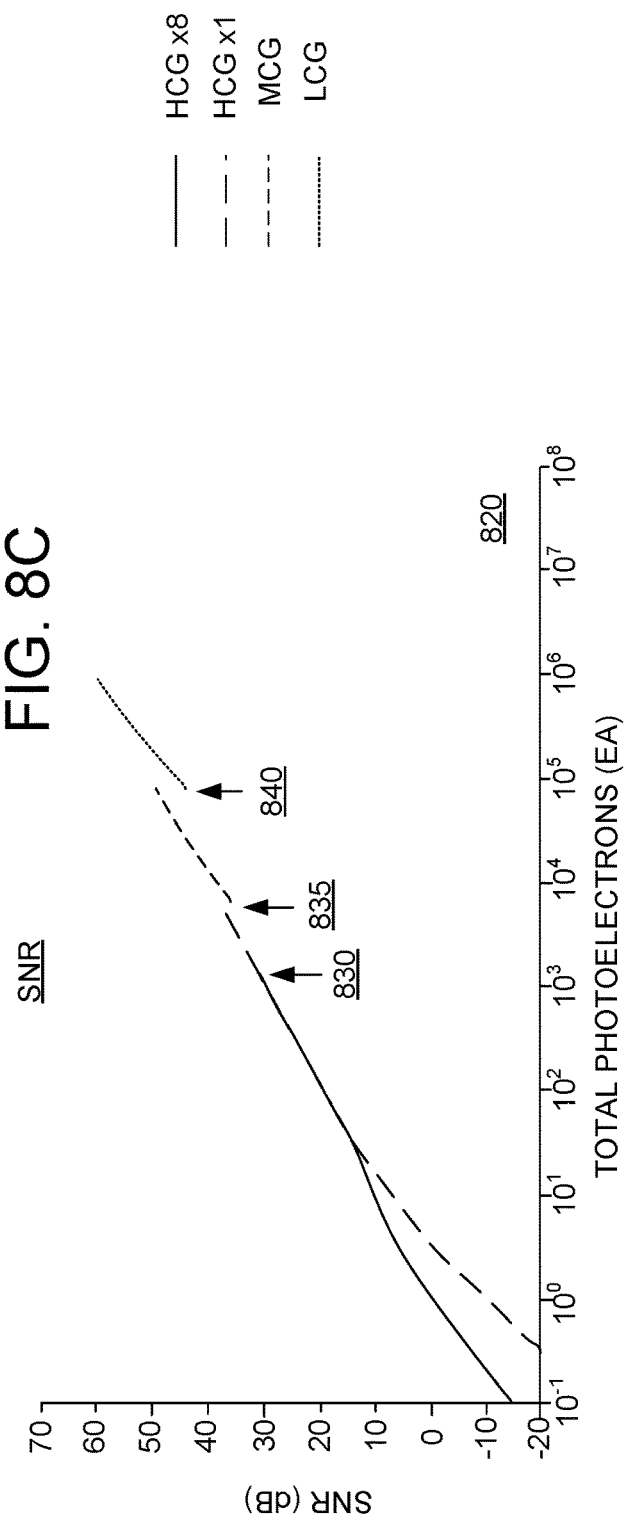
FIG. 8C shows an example signal to noise ratio plot based on the simulations of FIGS. 8A and 8B.

FIGS. 8A, 8B, and 8C show plots indicating a simulation of the performance of the pixel shown in FIG. 2A. FIG. 8A shows a plot 800 indicating a sensor response for each pixel phase, indicating a sensor output for a number of total photoelectrons. FIG. 8B shows a plot 810 indicating temporal noise for each pixel phase for a number of total photoelectrons. FIG. 8C shows a plot 820 indicating a signal to noise ratio for each pixel phase per total photoelectrons. For each plot, curves are presented for HCG ×8 (solid lines), HCG ×1 (large dashes), MCG (medium dashes), and LCG (small dashes).

Simulation parameters included triple conversion gains of 220 µV/e, 18 µV/e, and 1.5 µV/e. Integration time was set at 11.1 ms. Dark current for the photodiode was set at 7.0e/s @30C, while dark current for the floating diffusion was set at 5,000e/s @30C. Read noise for the pixel was calibrated at 0.5e-. The ADC swing was set to 1.2V (VDDA=3.3V), and the ADC bit-depth was 12 bits.

Plot 800 indicates the sensor response, similar to FIG. 5, though shown here in logarithmic form. The X-axis indicates exposure, while the Y-axis indicates the sensor output. A margin is generated between the HCG 8× and HCG 1×. When the HCG 1× is saturated, the response progresses to the MCG, then to the LCG.

Plot 810 shows temporal noise on the Y-axis and exposure on the X-axis. The HCG 8× displays the lowest temporal noise, followed by the HCG 1×. The MCG and the LCG have very high temporal noise e.g., 100 e-, 500 e-noise. However, the HCG is being exclusively activated under extreme low light conditions. When higher levels of exposure are experienced, this temporal noise is dominated by photon-shot noise, and is small compared to the sensor output. In this way, the dynamic range can be extended towards 120 dB without negatively impacting image quality.

Plot 820 shows signal-to-noise-ratio (SNR) across exposure levels. In the case of lateral overflow, where there are multiple exposures, and multiple images combined to achieve HDR, pixels are prone to noise at these transition regions, shown at 830, 835, and 840. In general, it is beneficial to maintain this SNR drop above 25-30 dB to hide any noise at the transition regions. For the depicted gain stage ratios (10× between stages), each transition meets this quality. The SNR at the first transition (830) between HCG ×8 and HCG ×1 is approximately 25 dB, while the second transition (835) between HCG ×1 and MCG, and the third transition (840) between MCG and LCG are both above 35 dB. As the ratio between relative gain stages is increased towards 16× or even 50×, this SNR drop may become bigger and bigger. As such, 10× gain stage ratios represent a functional design parameter, but increasing or compressing this ratio (e.g., 5×-20×) may increase performance of a given pixel, based on sensor parameters and noise levels.

In some examples, the methods and processes described herein may be tied to a computing system of one or more computing devices. In particular, such methods and processes may be implemented as a computer-application program or service, an application-programming interface (API), a library, and/or other computer-program product.

Figure 9:
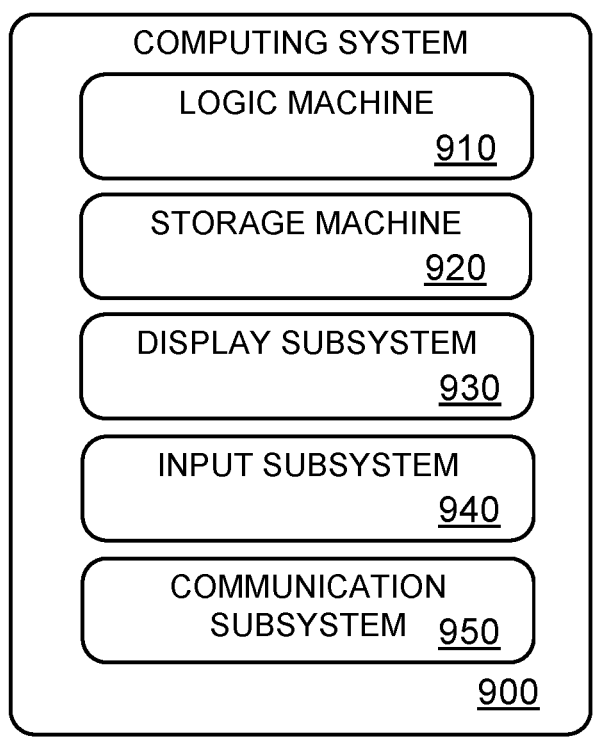
FIG. 9 schematically shows an example computing environment.

FIG. 9 schematically shows a non-limiting embodiment of a computing system 900 that can enact one or more of the methods and processes described above. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices.

Computing system 900 includes a logic machine 910 and a storage machine 920. Computing system 900 may optionally include a display subsystem 930, input subsystem 940, communication subsystem 950, and/or other components not shown in FIG. 9.

Logic machine 910 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 920 includes one or more physical devices configured to hold instructions executable by the logic machine to implement the methods and processes described herein. When such methods and processes are implemented, the state of storage machine 920 may be transformed—e.g., to hold different data.

Storage machine 920 may include removable and/or built-in devices. Storage machine 920 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 920 may include volatile, nonvolatile, dynamic, static, read/write, read-only, random-access, sequential-access, location-addressable, file-addressable, and/or content-addressable devices.

It will be appreciated that storage machine 920 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 910 and storage machine 920 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 930 may be used to present a visual representation of data held by storage machine 920. This visual representation may take the form of a graphical user interface (GUI). As the herein described methods and processes change the data held by the storage machine, and thus transform the state of the storage machine, the state of display subsystem 930 may likewise be transformed to visually represent changes in the underlying data. Display subsystem 930 may include one or more display devices utilizing virtually any type of technology. Such display devices may be combined with logic machine 910 and/or storage machine 920 in a shared enclosure, or such display devices may be peripheral display devices.

When included, input subsystem 940 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 950 may be configured to communicatively couple computing system 900 with one or more other computing devices. Communication subsystem 950 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

In another example, an image sensor comprises a plurality of sensing pixels, wherein each of the sensing pixels comprises a photodetector, a floating diffusion capacitor in electrical communication with the photodetector, a transfer gate configured to control charge flow between the photodetector and the floating diffusion capacitor, a lateral overflow storage capacitor configured to store charge overflow from the floating diffusion capacitor, a lateral overflow control gate configured to control charge flow between the floating diffusion capacitor and the lateral overflow storage capacitor, first readout circuitry comprising a first amplifier, the first readout circuitry located between the transfer gate and the lateral overflow control gate, and second readout circuitry comprising a second amplifier, the second readout circuitry located on an opposite side of the lateral overflow control gate as the first readout circuitry; and a controller configured to control the image sensor to perform an image integration, in a first readout, readout charge stored on the floating diffusion capacitor using the first readout circuitry and readout charge stored on the lateral overflow storage capacitor using the second readout circuitry, and in a second readout, readout charge stored on the photodetector using the first readout circuitry with a first amplification applied and readout the charge stored on the photodetector with a second, different amplification applied. In such an example, or any other example, the controller is additionally or alternatively configured to control the image sensor to during the first readout, and prior to the second readout, energize a reset gate and read out a first reset signal. In any of the preceding examples, or any other example, the controller is additionally or alternatively configured to control the image sensor to, during the second readout, prior to reading out charge stored on the photodetector, energize the reset gate and read out a second reset signal. In any of the preceding examples, or any other example, during the first readout, charge is additionally or alternatively readout from the floating diffusion capacitor and from the lateral overflow storage capacitor concurrently. In any of the preceding examples, or any other example, during the second readout, charge is additionally or alternatively readout from the photodetector with the first amplification and the second, amplification applied concurrently. In any of the preceding examples, or any other example, the floating diffusion capacitor is additionally or alternatively configured with a higher conversion gain than the lateral overflow storage capacitor. In any of the preceding examples, or any other example, the controller is additionally or alternatively configured to control the image sensor to energize the transfer gate when the photodetector is empty; readout charge stored at the floating diffusion capacitor; and estimate gate-induced source leakage based on the charge accumulated at the floating diffusion capacitor.

In another example, an image sensor, comprises a plurality of sensing pixels, wherein each of the sensing pixels comprises a photodiode; a floating diffusion capacitor in electrical communication with the photodiode; a transfer gate configured to control charge flow between the photodiode and the floating diffusion capacitor; a first lateral overflow storage capacitor configured to store charge overflow from the floating diffusion capacitor; a first lateral overflow control gate configured to control charge flow between the floating diffusion capacitor and the first lateral overflow storage capacitor; a second lateral overflow storage capacitor configured to store charge overflow from the first lateral overflow storage capacitor; a second lateral overflow control gate configured to control charge flow between the first lateral overflow storage capacitor and the second lateral overflow storage capacitor; first readout circuitry comprising a first amplifier, the first readout circuitry located between the transfer gate and the first lateral overflow control gate; and second readout circuitry comprising a second amplifier, the second readout circuitry located on an opposite side of the first lateral overflow control gate as the first readout circuitry. In such an example, or any other example, the floating diffusion capacitor is additionally or alternatively configured with a first conversion gain, the first lateral overflow storage capacitor is additionally or alternatively configured with a second conversion gain, lower than the first conversion gain, and the second lateral overflow storage capacitor is additionally or alternatively configured with a third conversion gain, lower than the second conversion gain. In any of the preceding examples, or any other example, the first conversion gain is additionally or alternatively in the range of 5×-20× gain relative to the second conversion gain, and the second conversion gain is additionally or alternatively in the range of 5×-20× gain relative to the third conversion gain. In any of the preceding examples, or any other example, the first readout circuitry and the second readout circuitry each additionally or alternatively include at least a source follower, a row select transistor, and a collection node. In any of the preceding examples, or any other example, one or more of the first lateral overflow storage capacitor and the second lateral overflow storage capacitor additionally or alternatively comprise metal-insulator-metal capacitors. In any of the preceding examples, or any other example, in one or more of the first lateral overflow storage capacitor and the second lateral overflow storage capacitor are additionally or alternatively dynamic random-access memory (DRAM) capacitors. In any of the preceding examples, or any other example, each of the sensing pixels additionally or alternatively comprises a third lateral overflow storage capacitor configured to store charge overflow from the second lateral overflow storage capacitor; a third lateral overflow control gate configured to control charge flow between the second lateral overflow storage capacitor and the third lateral overflow storage capacitor; and third readout circuitry comprising a third amplifier, the third readout circuitry located on an opposite side of the second lateral overflow control gate as the second readout circuitry.

In yet another example, a method of operating an image sensor to compensate for spatial noise, the image sensor comprising a plurality of sensing pixels, each sensing pixel comprising a photodiode, a floating diffusion capacitor, and a transfer gate to control transfer of charge between the photodiode and the floating diffusion capacitor, the method comprises, for each of the sensing pixels, integrate charge at the photodiode during an image integration; following the image integration, transfer charge from the photodiode to the floating diffusion capacitor by applying a first energization to the transfer gate, thereby adding a first amount of gate-induced source leakage (GISL) charge to the floating diffusion capacitor; read a first voltage across the floating diffusion capacitor; apply a second energization to the transfer gate while the charge from the photodiode and the first amount of GISL charge is stored on the floating diffusion capacitor; read a second voltage across floating diffusion capacitor; and determine a pixel signal intensity based upon the first voltage and the second voltage. In such an example, or any other example, charge is additionally or alternatively not integrated at the photodiode between the first energization of the transfer gate and the second energization of the transfer gate. In any of the preceding examples, or any other example, the image sensor additionally or alternatively generates an image frame based on determined pixel signal intensities from the plurality of sensing pixels without applying additional spatial noise compensation to the determined pixel signal intensities. In any of the preceding examples, or any other example, the image integration additionally or alternatively occurs during conditions wherein the photodiode is not saturated during the image integration. In any of the preceding examples, or any other example, each sensing pixel additionally or alternatively includes multiple conversion gain stages, and the second voltage is additionally or alternatively subtracted from signal readout from a high conversion gain stage and not from another conversion gain stage. In any of the preceding examples, or any other example, determining the pixel signal intensity based upon the first voltage and the second voltage additionally or alternatively includes subtracting the second voltage from the first voltage.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method of operating an image sensor to compensate for spatial noise, the image sensor comprising a plurality of sensing pixels, each sensing pixel comprising a photodiode, a floating diffusion capacitor, and a transfer gate to control transfer of charge between the photodiode and the floating diffusion capacitor, the method comprising:

for each of the sensing pixels,
  integrate charge at the photodiode during an image integration;
  following the image integration, transfer charge from the photodiode to the floating diffusion capacitor by applying a first energization to the transfer gate, thereby adding a first amount of gate-induced source leakage (GISL) charge to the floating diffusion capacitor;
  read a first voltage across the floating diffusion capacitor;
  apply a second energization to the transfer gate while the charge from the photodiode and the first amount of GISL charge is stored on the floating diffusion capacitor;
  read a second voltage across floating diffusion capacitor; and determine a pixel signal intensity based upon the first voltage and the second voltage.

2. The method of claim 1, wherein charge is not integrated at the photodiode between the first energization of the transfer gate and the second energization of the transfer gate.

3. The method of claim 1, wherein the image sensor generates an image frame based on determined pixel signal intensities from the plurality of sensing pixels without applying additional spatial noise compensation to the determined pixel signal intensities.

4. The method of claim 1, wherein the image integration occurs during conditions wherein the photodiode is not saturated during the image integration.

5. The method of claim 1, wherein each sensing pixel includes multiple conversion gain stages, and wherein the second voltage is subtracted from signal readout from a high conversion gain stage and not from another conversion gain stage.

6. The method of claim 1, wherein determining the pixel signal intensity based upon the first voltage and the second voltage includes subtracting the second voltage from the first voltage.

\* \* \* \* \*